United States Patent [19]
Deubler et al.

[11] Patent Number: 6,094,357
[45] Date of Patent: Jul. 25, 2000

[54] PRODUCT HAVING A RECHARGEABLE BATTERY WHICH IS HELD IN A MECHANICALLY STABLE MANNER AND IS EASY TO REMOVE

[75] Inventors: Hans Deubler; Karl Hintermann, both of Klagenfurt; Walter Planegger, Launsdorf; Peter Schaller, St. Veit, all of Austria

[73] Assignee: U.S. Philips Corporation, New York, N.Y.

[21] Appl. No.: 09/198,932

[22] Filed: Nov. 24, 1998

[30] Foreign Application Priority Data

Nov. 17, 1997 [EP] European Pat. Off. .............. 97890236

[51] Int. Cl.[7] ...................................................... H05K 1/18
[52] U.S. Cl. .......................... 361/782; 361/748; 361/728; 361/760; 361/807; 361/809; 429/100; 429/164; 174/254; 174/255; 174/260
[58] Field of Search .................................... 361/782, 748, 361/728, 737, 760, 777, 779, 807, 809, 811; 429/100, 90, 164; 174/260, 254, 255

[56] References Cited

U.S. PATENT DOCUMENTS

| 4,216,523 | 8/1980 | Harford .................................... 361/729 |
| 4,283,796 | 8/1981 | Hughes .................................... 455/349 |
| 4,835,452 | 5/1989 | Kuriyama ................................. 320/114 |
| 5,424,725 | 6/1995 | Wandt et al. ......................... 340/825.44 |
| 5,471,016 | 11/1995 | Krainer et al. ........................... 174/254 |
| 5,790,040 | 8/1998 | Kreier et al. ............................. 340/693 |
| 5,831,834 | 11/1998 | Landolf ................................... 361/782 |

FOREIGN PATENT DOCUMENTS

0432331B1  6/1991  European Pat. Off. ......... H01M 2/10

*Primary Examiner*—Leo P. Picard
*Assistant Examiner*—David Foster
*Attorney, Agent, or Firm*—Ernestine C. Bartlett

[57] ABSTRACT

In a product including a printed circuit board which comprises a printed-circuit part and a terminal part and including a rechargeable battery having two terminals, and including retaining device for mechanically retaining the battery, the retaining device and the printed circuit board are arranged and constructed so as to be mechanically separate from one another, in such a manner that the printed circuit board does not form part of the retaining device, and each of the two terminals of the battery is connected to a terminal zone on the terminal part of the printed circuit board in an electrically conductive manner via a mechanically flexible and electrically conductive connecting device.

6 Claims, 3 Drawing Sheets

PRODUCT HAVING A RECHARGEABLE BATTERY WHICH IS HELD IN A MECHANICALLY STABLE MANNER AND IS EASY TO REMOVE

BACKGROUND OF THE INVENTION

The invention relates to a product including a printed circuit board which comprises a printed-circuit part having at least one conductor track and which comprises a terminal part which is connected to the printed-circuit part along a breaking zone and which can be removed from the printed-circuit part by severing the breaking zone, and including a rechargeable battery having two terminals, which are each connected to a terminal zone on the terminal part of the printed circuit board in an electrically conductive manner, and including retaining means for mechanically retaining the battery, which battery, after the terminal part of the printed circuit board has been severed from the printed-circuit part of the printed circuit board, together with the severed terminal part of the printed circuit board can be removed from the product in order to dispose of the battery.

Such a product of the type defined in the opening paragraph is known, for example, from the document EP 0 432 331 B1. This known product is a dry-shaver, which is shown in FIGS. 37, 38 and 39 and described in column 13, lines 6 to 51 of said document.

In the known product the cylindrical battery has a radially projecting solder lug at the location of each of its two terminals, which are situated at the axial ends of the battery, and the two solder lugs each have a terminal zone connected mechanically as well as electrically to the terminal part of the printed circuit board, two solder lugs of the battery thus being used not only for the electrical connection of the battery but also for mechanically securing the battery to the product, in the present case to the break-away terminal part of the printed circuit board. For mechanically fastening the battery the known product in addition comprises retaining means which, in the present case, are formed by two lugs of different lengths of a locking member which is movable between an open position and a locking position, which lugs lie against the circumferential surface of the battery and thus eliminate play when the locking member is in its locking position. In the known product, as already stated hereinbefore, the break-away terminal part of the printed circuit board is also used for mechanically securing the battery. However, as a result of this the problem arises that owing to the comparatively large mass of the battery, when the known product is subjected to a comparatively high impact load, as may occur in the case that the product is inadvertently dropped and in similar cases, the break-away terminal part of the printed circuit board may be subject to such a high mechanical load that the breaking zone of the printed circuit board is severed, after which the battery is no longer retained correctly in the product and the correct operation of the product is impaired, or at least the printed circuit board is damaged, for example conductor tracks which extend across the breaking zone of the printed circuit board, as a result of which the known apparatus is not capable of operating correctly.

SUMMARY OF THE INVENTION

It is an object of the invention to preclude the aforementioned problems and to provide an improved product whose correct operation cannot be impaired as a result of the comparatively large mass of the rechargeable battery, even in the case that the product is subjected to a high impact load. According to the invention, in order to achieve this object in a product of the type defined in the opening paragraph, the retaining means and the printed circuit board are arranged and constructed so as to be mechanically separate from one another, in such a manner that the printed circuit board does not form part of the retaining means for mechanically retaining the battery, and each of the two terminals of the battery is connected to a terminal zone on the terminal part of the printed circuit board in an electrically conductive manner via a mechanically flexible and electrically conductive connecting means. Thus, it is achieved with only a small expense and by simple means that the rechargeable battery can be secured in a product in accordance with the invention with a high mechanical stability, so that even in the case of high impact loads a reliable mechanical fastening of the battery is assured and that, in addition, the rechargeable battery can be removed in a simple manner, as a result of which the rechargeable battery can also be removed easily from the product in accordance with the invention by a layman in order to dispose of the battery. A further advantage of the product in accordance with the invention is that such a product in accordance with the invention requires only a small terminal part for the printed circuit board so that for given dimensions—as is very often the case with such a product—the available space can be utilized for an advantageously large part for the printed-circuit part of the printed circuit board.

A product in accordance with the invention may comprise differently constructed retaining means for mechanically retaining the rechargeable battery. In a product in accordance with the invention, a product is provided that includes a printed circuit board which comprises a printed-circuit part having at least one conductor track and which comprises a terminal part which is connected to the printed-circuit part along a breaking zone and which can be removed from the printed-circuit part by severing the breaking zone. The product also includes a rechargeable battery having two terminals which are each connected to a terminal zone on the terminal part of the printed circuit board in an electrically conductive manner, and retaining means for mechanically retaining the battery, which battery, after the terminal part of the printed circuit board has been severed from the printed-circuit part of the printed circuit board, together with the severed terminal part of the printed circuit board can be removed from the product in order to dispose of the battery; wherein the retaining means and the printed circuit board are arranged and constructed so as to be mechanically separate from one another, in such a manner that the printed circuit board does not form part of the retaining means for mechanically retaining the battery, and each of the two terminals of the battery is connected to a terminal zone on the terminal part of the printed circuit board in an electrically conductive manner via a mechanically flexible and electrically conductive connecting means. In such a product, it has proved to be very advantageous if, in addition, the retaining means are formed by bounding portions of a receptacle for holding the battery. Such an embodiment is advantageous for a particularly reliable fastening of the rechargeable battery because the bounding portions of a receptacle enclose and thereby retain the rechargeable battery at substantially all sides.

In such a product having the characteristic features which product has a housing for accommodating the printed circuit board, the rechargeable battery and the retaining means—as is known per se from the document EP O 432 331 B1—it has proved to be particularly advantageous if, in addition, the product has a housing for accommodating the printed circuit board, the rechargeable battery and the retaining means, wherein the receptacle has been provided in a battery drawer which can be pulled out of the housing of the product, which battery drawer also accommodates the printed circuit board adjacent the receptacle. Such a construction with a pull-out battery drawer has proved to be advantageous for a particularly simple removal of the rechargeable battery from the product.

In a product in accordance with the invention, the mechanically flexible and electrically conductive connecting means may be constituted, for example, by contact springs. However, in such a product, it has proved to be particularly advantageous if, in addition, the the two mechanically flexible and electrically conductive connecting means are each constituted by a length of wire, of which each length of wire has one end connected to a terminal of the battery and has its other end connected to a solder pad forming a terminal zone on the terminal part of the printed circuit board. Such an embodiment is not only particularly cheap but also has the additional advantage that in relation to the position of the rechargeable battery the terminal part of the printed circuit board can be arranged in the apparatus substantially without any limitations, because the lengths of wire can be fitted into or onto the product at any desired location.

In such a product, it has proved to be very advantageous if, in addition, the terminal part of the printed circuit board exclusively carries the two solder pads forming the terminal zones and two conductor track portions which lead to the two solder pads and which form part of two conductor tracks which extend from the printed-circuit part to the terminal part across the breaking zone. Such an embodiment of the invention has the advantage that the terminal part of the printed circuit board can be made very small.

In such a product, it has proved to be particularly advantageous if, in addition, only a separating slot, which extends between the printed-circuit part and the terminal part, and one or at the most two connecting limbs, which interconnect the printed-circuit part and the terminal part, are situated in the breaking zone. This is advantageous both in view of a very simple construction and in view of an easy separation of the terminal part of the printed circuit board from the printed-circuit part of the printed circuit board.

The aforementioned aspects as well as further aspects of the invention will be apparent from the two embodiments described hereinafter by way of examples and will be elucidated with the aid of these two embodiments.

BRIEF DESCRIPTION OF THE DRAWINGS

The invention will now be described in more detail with reference to the drawings which show two embodiments given by way of examples to which the invention is not limited.

DESCRIPTION OF THE PREFERRED EMBODIMENTS

Figure 1:
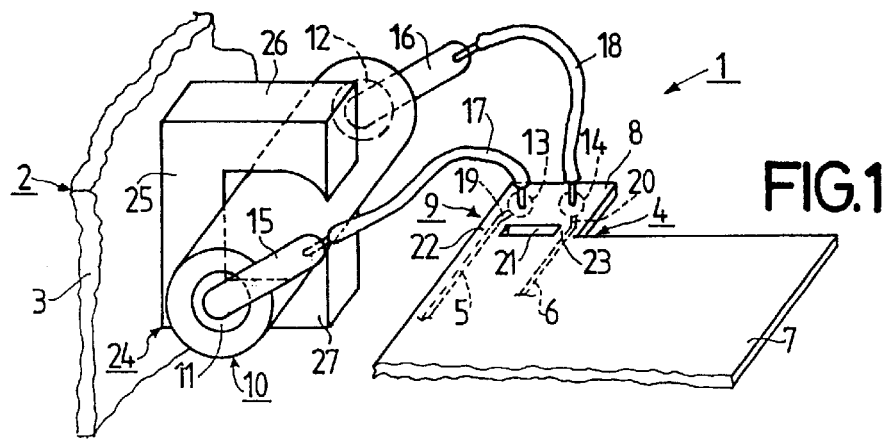
FIG. 1 highly diagrammatically shows a part of a product in accordance with a first embodiment of the invention, which product is a dry-shaver.

FIG. 1 highly diagrammatically shows the part of a product, namely an electric dry-shaver 1. The dry-shaver 1 has a housing 2, of which a housing wall 3 is shown partly in FIG. 1.

The housing 2 of the dry-shaver 1 accommodates a printed circuit board 4. The printed circuit board 4 comprises a printed-circuit part 7 which serves to carry at least one electrical component, not shown in FIG. 1, and which has conductor tracks, of which two conductor tracks 5 and 6 are shown in FIG. 1. In addition, the printed circuit board 4 has a terminal part 8, which is connected to the printed-circuit part 7 along a breaking zone 9 and which can be separated from the printed-circuit part 7 by severing the breaking zone 9.

The housing 2 of the dry-shaver 1 further accommodates a rechargeable battery 10. The rechargeable battery 10 is essentially cylindrical and has a terminal, 11 and 12 respectively, at each of its two axial ends. The terminals 11 and 12 are each electrically connected to a respective terminal zone, 13 and 14, on the terminal part 8 of the printed circuit board 4. In order to realize these electrically conductive connections a solder lug, 15 and 16 respectively, is connected to each of the two terminals 11 and 12 of the battery 10. Furthermore, each of the two terminals 11 and 12 of the battery 10 is electrically connected to a terminal zone, 13 and 14 respectively, on the terminal part 8 of the printed circuit board 4 via a mechanically flexible and electrically conductive connecting means, 17 and 18 respectively. In the present case, the two mechanically flexible and electrically conductive connecting means 17 and 18 are each constituted in a particularly simple manner by a length of wire, of which each length of wire, 17 and 18 respectively, has one end connected to a terminal, 11 and 12 respectively, of the battery 10, namely via a respective solder lug 15 or 16, and has its other end connected to a terminal zone, 13 and 14 respectively, on the terminal part 8 of the printed circuit board 4. In the present case, the two terminal zones 13 and 14 are simply formed by two solder pads through whose central bores the free ends of the two lengths of wire 17 and 18 have been passed.

In the dry-shaver 1 shown in FIG. 1 the terminal part of the printed circuit board only carries the two solder pads forming the terminal zones 13 and 14 and the two conductor track portions 19 and 20 which lead to the two solder pads and which form part of the two conductor tracks 5 and 6 which extend from the printed-circuit part 7 to the terminal part 8 across the breaking zone 9.

As can also be seen in FIG. 1, only a separating slot 21, which extends between the printed-circuit part 7 and the terminal part 8, and two connecting limbs 22 and 23, which interconnect the printed-circuit part 7 and the terminal part 8, are situated in the breaking zone 9 in the dry-shaver 1.

The dry-shaver 1 shown in FIG. 1 further comprises retaining means 24, accommodated in the housing 2 of the dry-shaver 1, for mechanically retaining the battery 10. In an advantageous manner the retaining means 24 and the printed circuit board 4 are arranged and constructed so as to be mechanically separate from one another, in such a manner that the printed circuit board 4 does not form part of the retaining means 24 for mechanically retaining the battery 10. In the present case of the dry-shaver 1 shown in FIG. 1 the retaining means 24 comprise a crosspiece 25, which is integral with the housing wall 3 of the housing 2, and two retaining limbs 26 and 27, which project from the crosspiece 25 substantially perpendicularly to the housing wall 3 and whose facing bounding surfaces are adapted in shape to the cylindrical shape of the circumferential surface of the battery 10 and engage around the circumferential surface, so that the battery 10 is thus secured in the dry-shaver 1 in a mechanically very reliable and stable manner by the two retaining limbs 26 and 27 and the crosspiece 25, whose bounding surface which faces the battery 10 also engages with the circumferential surface of the battery 10. As a result, even in the case that the dry-shaver 1 is subjected to high impact loads, a secure mechanical fastening of the battery 10 is assured.

The dry-shaver 1 shown in FIG. 1 also allows a simple removal of the rechargeable battery 10, as a result of which the rechargeable battery 10 can also be removed easily from the dry-shaver 1 in accordance with the invention by a layman to dispose of the battery 10, for example in the case that the dry-shaver 1 is no longer worth repairing after a long service life or can no longer be repaired at all and should therefore be disposed of, but in which case the battery 10, which is essentially built fixedly into the dry-shaver 1, should be disposed of separately.

To dispose of the battery 10, it is merely required to insert a simple tool, for example a screwdriver, into the separating slot 21, which extends between the printed-circuit part 7 and the terminal part 8, and subsequently to move it towards the printed circuit board 4 with its handle portion, as a result of which such a leverage is exerted on the terminal part 8 of the printed circuit board 4 in the area of the breaking zone 9 that the terminal part 8 is prized away from the printed-circuit part 7 by severing the breaking zone 9. Subsequently, the battery 10 merely has to be slid out of the retaining means 24 in its longitudinal direction, after which the battery 10 together with the terminal part 8, which is connected to the battery 10 via the two lengths of wire 17 and 18 and the solder lugs 15 and 16, can be removed from the dry-shaver 1.

It is to be noted that in the dry-shaver 1 shown in FIG. 1 the terminal part 8 of the printed circuit board 4 can be very small because this terminal part 8 only carries the two terminal zones 13 and 14 in then form of solder pads and the very short conductor-track portions which lead to the two solder pads.

FIGS. 2 and 3 and 4 to 9 show a battery drawer 28 of a product in accordance with a second embodiment of the invention. The product is an electric toothbrush 29. The toothbrush 29 comprises a housing 30 which serves to accommodate a printed circuit board 31, a rechargeable battery 32 and retaining means 33 for mechanically retaining the battery 32.

Figure 2:
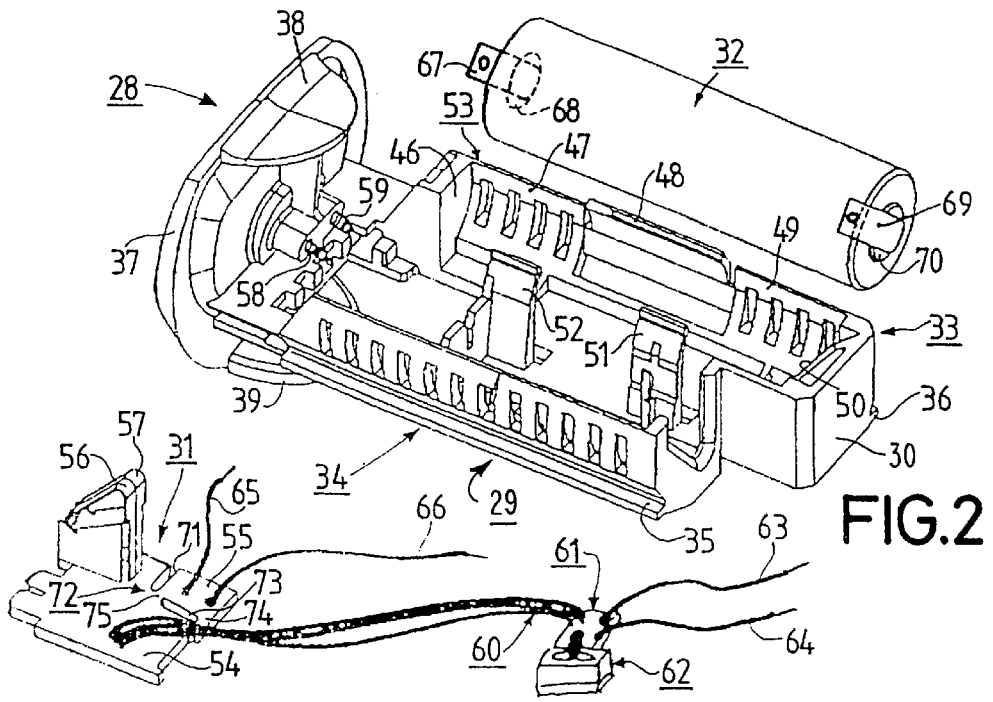
FIG. 2 shows a battery drawer of a product in accordance with a second embodiment of the invention, which product is an electric toothbrush, a rechargeable battery which can be placed into the battery drawer and a printed circuit board having a break-away terminal part being shown in positions in which they are not yet situated in the drawer.
Figure 3:
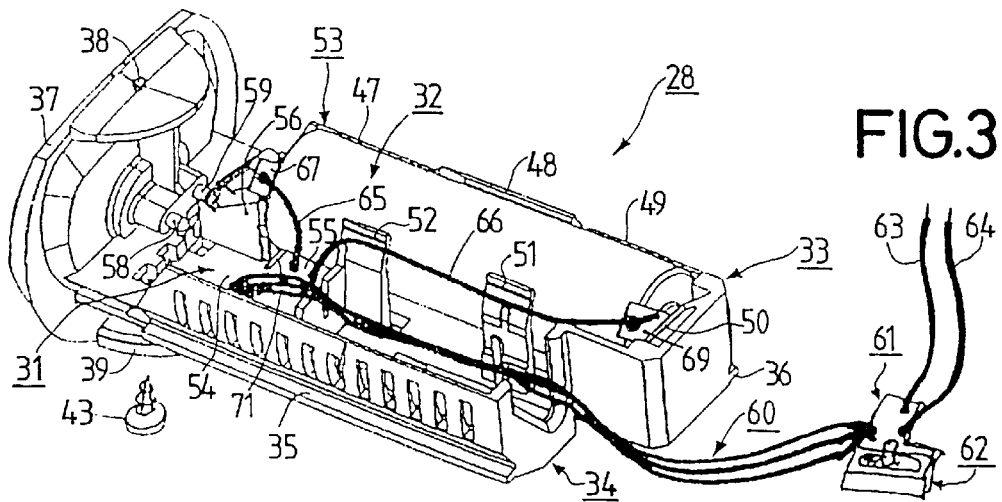
FIG. 3 shows the battery drawer of FIG. 2 in a way similar to FIG. 2, the rechargeable battery and the printed circuit board being shown in their positions in the battery drawer.

The toothbrush 29 comprises a battery drawer 28 which can be pulled out of the housing 30 of the toothbrush 29 and which is shown in FIGS. 2 and 3. The battery drawer 28 comprises a basic element 34 provided with two guide ribs 35 and 36, which serve for slidably guiding the battery drawer 28 and which are engageable in guide grooves, not shown, inside the housing 30 of the toothbrush 29. A cover 37 is integrally connected to the basic element 34. Two grip portions 38 and 39 project from the cover 37 and are each engageable in a recess, 40 and 41 respectively, in the housing 30 of the toothbrush 29. One grip portion 39 has a bore 42 through which a fixing screw 43 can be passed. The fixing screw 43 can be screwed into a bore 44 formed in a mounting portion 45 connected to the housing 30.

In the toothbrush 29 shown in FIGS. 2 to 9 the retaining means 33 for mechanically securing the battery 32 are formed by bounding portions 46, 47, 48, 49, 50, 51 and 52 of a receptacle 53 for holding the battery 32. The receptacle 53 is formed in the battery drawer 28 which can be pulled out of the housing 30 of the toothbrush 29. Of the bounding portions 46 to 52 the bounding portions 48, 51 and 52 are formed by retaining clips which can deflect elastically at least in the area of their free ends.

The battery drawer 28 also accommodates the printed circuit board 31 adjacent the receptacle 53. The printed circuit board 31 adjoins the receptacle 53. Thus, the retaining means 33 and the printed circuit board 31 in the toothbrush 29 are also arranged and constructed so as to be mechanically separate from one another, in such a manner that the printed circuit board 4 does not form part of the retaining means 33 for mechanically retaining the battery 32.

Similarly to the printed circuit board 4 of the dry-shaver 1, the printed circuit board 31 of the toothbrush 29 has a printed-circuit part 54 and a terminal part 55. The printed-circuit part 54 carries two resilient contacts 56 and 57 for establishing an electrically conductive connection to two contact pins 58 and 59 which extend through the cover 37. The two contact pins 58 and 59 have been molded in during the manufacture of the plastic battery drawer 28 and have thus been secured to the cover 37. The two contact pins 58 and 59 serve for the connection of an external charging device for charging the rechargeable battery 32. In the present case, connection leads 60 are also connected to the printed-circuit part 54 and lead to a further printed circuit board 61 which carries an electrical switch 62, which can be actuated by the user of the toothbrush 29 and serves for turning on and turning off an electric drive motor, not shown, which is accommodated in the toothbrush 29 and is connected to two connection leads 63 and 64.

In the toothbrush 29 are connected to the terminal part 55 of the printed circuit board 31, in exactly the same way as in the dry-shaver 1 shown in FIG. 1, two lengths of wire 65 and 66, which serve as mechanically flexible and electrically conductive connecting means 65 and 66, i.e. by means of two terminal zones which are each formed by a solder pad. One length of wire 65 is connected to a solder lug 67 mounted on a terminal 68 of the battery 32. The other length of wire 66 is connected to a further solder lug 69 of the battery 32, which lug is mounted on a further terminal 70 of the battery 32.

Between the printed-circuit part 54 and the terminal part 55 of the printed circuit board 31 a recess 71 has been provided. The printed circuit board 31, similarly to the printed circuit board 4 of the dry-shaver 1 shown in FIG. 1, has a breaking zone 72 and also in this case only a separating slot 73, which extends between the printed-circuit part 54 and the terminal part 55, and two connecting limbs 74 and 75, which interconnect the printed-circuit part 54 and the terminal part 55, are situated in the breaking zone 72.

In order to dispose of the battery 32 of the toothbrush 29, which battery is essentially built fixedly into the toothbrush 29, the steps described hereinafter with reference to FIGS. 4 to 9 should be carried out.

Figure 4:
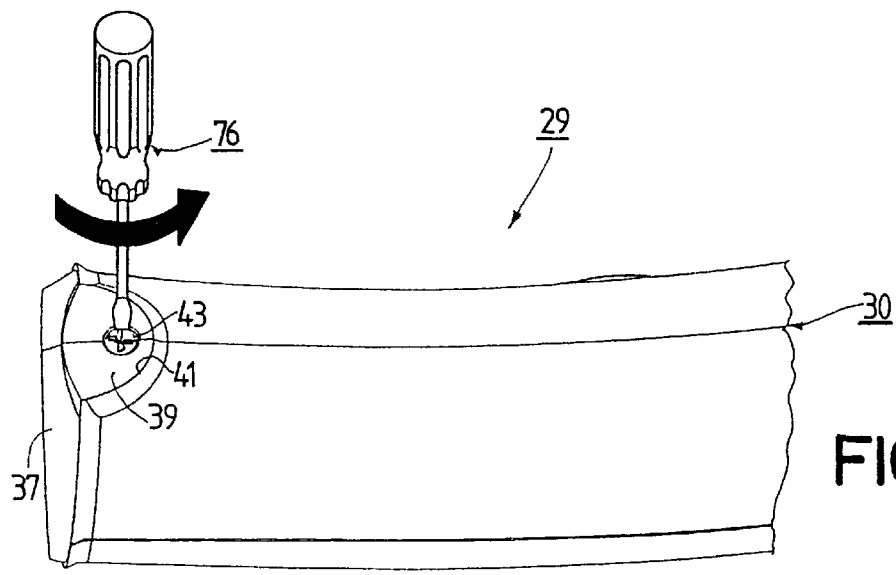
FIG. 4 shows a part of the toothbrush comprising the battery drawer of FIGS. 2 and 3, the battery drawer being in its operating position slid into the toothbrush.
Figure 5:
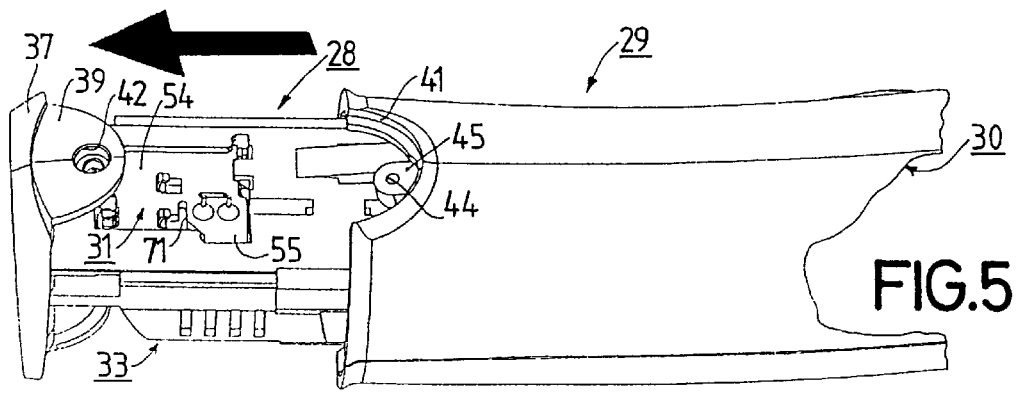
FIG. 5 shows the toothbrush of FIG. 4 in a manner similar to FIG. 4, the battery drawer being in a battery-removal position slid out of the toothbrush.

First of all, the fixing screw 43 must be loosened by means of a screwdriver 76, as is shown in FIG. 4. Subsequently, the battery drawer 28 must be pulled out of the housing 30 of the toothbrush 29, as is shown in FIG. 5.

Figure 6:
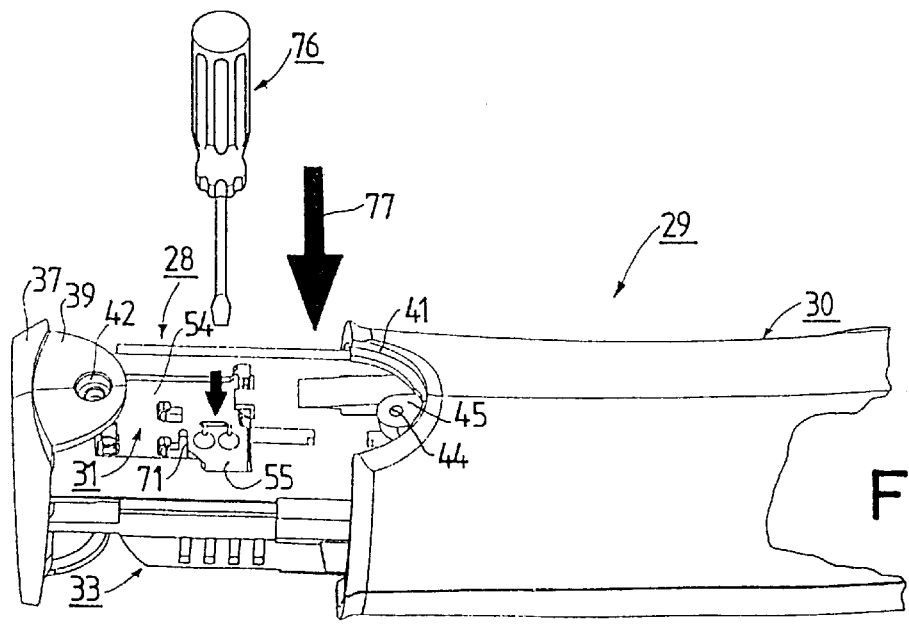
FIG. 6 shows the toothbrush of FIGS. 4 and 5 in a manner similar to FIG. 5 and in addition shows a screwdriver which serves for removing the terminal part from the printed circuit board.
Figure 7:
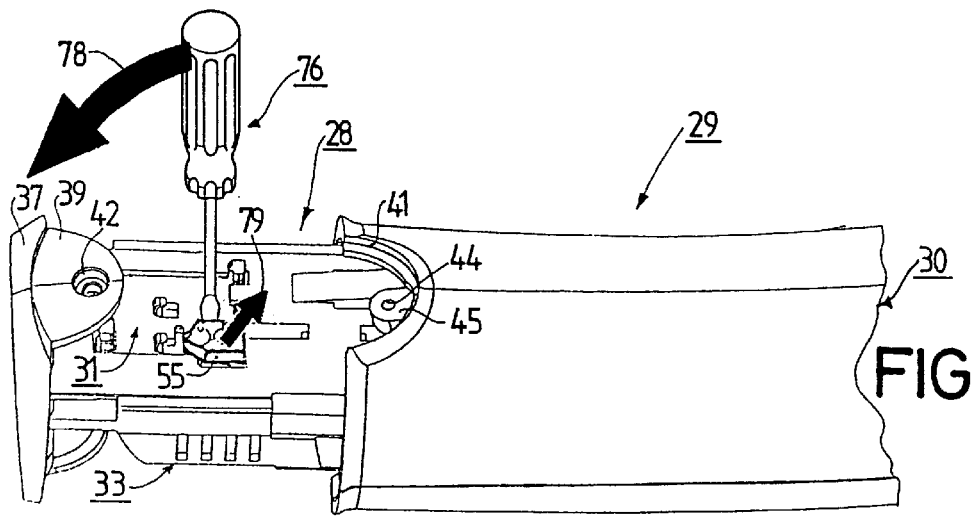
FIG. 7 shows the toothbrush of FIGS. 4, 5 and 6 in a manner similar to FIG. 6, the terminal part of the printed circuit board being shown in a battery-removal position in which it has been separated from the printed circuit board by means of the screwdriver.
Figure 8:
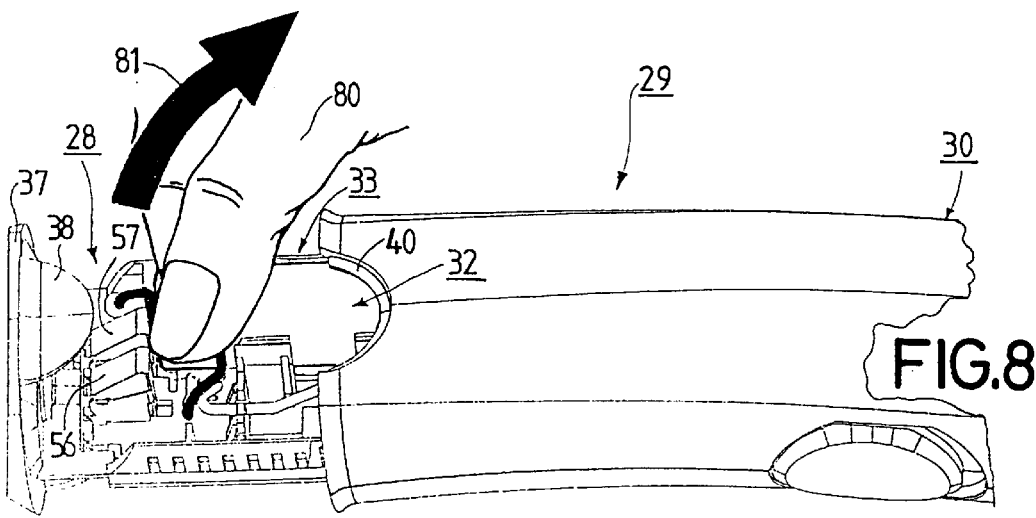
FIG. 8 shows the toothbrush of FIGS. 4 to 7 in a position in which it has been rotated through 180° with respect to its position in FIGS. 4 to 7 and illustrates how the rechargeable battery can be removed from the battery drawer after the terminal part of the printed circuit board has been separated from the remainder of the printed circuit board, i.e. from the printed-circuit part of this board.

As is shown in FIG. 6, the screwdriver 76 should now be inserted in the direction indicated by an arrow 77 into the separating slot 73 between the printed-circuit part 54 and the terminal part 55 of the printed circuit board 31. As illustrated in FIG. 7, the screwdriver 76 should subsequently be tilted in the direction indicated by an arrow 78, as a result of which the terminal part 55 of the printed circuit board 31 is prized away from the printed-circuit part 54 of the printed circuit board 31, as indicated by an arrow 79 in FIG. 7, in a manner similar to that for the dry-shaver 1 of FIG. 1.

Figure 9:
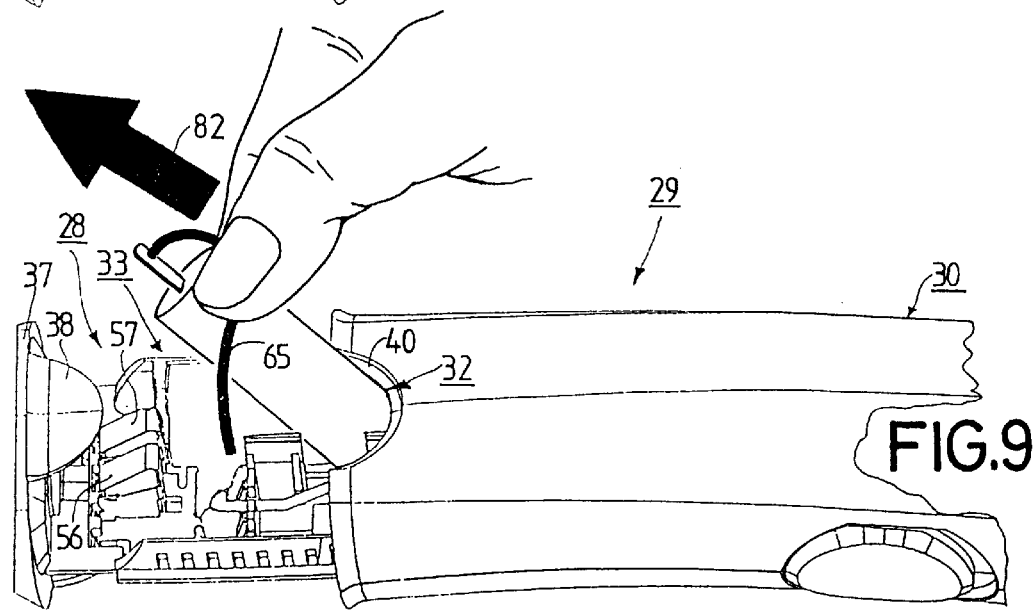
FIG. 9 shows the toothbrush of FIGS. 4 to 8 in a manner similar to FIG. 8 and illustrates how the rechargeable battery can be removed from the battery drawer and thus from the toothbrush.

Subsequently, the toothbrush 29 should be turned into a position rotated through 180° with respect to its position in FIGS. 4 to 7, as a result of which the end of the battery 32 situated nearer the cover 37 of the battery drawer 28 comes into a position in which by means of a finger 80 a force can be exerted on the battery 32, which force causes the battery 32 to be moved in the direction indicated by an arrow 81, after which the battery 32 is approximately in the removal position shown in FIG. 9. In the removal position shown in FIG. 9 the battery 32 can be pulled out of the battery drawer 28 in the direction indicated by an arrow 82, the terminal part 55 which has previously been prized away from the printed-circuit part 54 of the printed circuit board 31 being also removed from the toothbrush 29 during this pulling out.

The toothbrush 29 shown in FIGS. 2 to 9 has all the advantages which are also obtained with the dry-shaver 1 shown in FIG. 1. In addition, further advantages are obtained by the provision of the retaining means 33 and the printed circuit board 31 on the pull-out battery drawer 28, because this guarantees a very convenient removal of the battery 28 and of the terminal part 55 of the printed circuit board 31, which terminal part is connected to the battery by the lengths of wire 65 and 66.

The invention is not limited to the two embodiments described hereinbefore by way of examples. The invention can also be employed advantageously in a multitude of other products. It is obvious that it is also possible to provide two or more rechargeable batteries in a product in accordance with the invention, which batteries can be removed, in order to dispose of them, in a particularly simple manner from the relevant product owing to the measures in accordance with the invention. Moreover, the rechargeable batteries may have another shape.

What is claimed is:

1. A product including
   (1) a printed circuit board which comprises a printed-circuit part having at least one conductor track and a terminal part which is connected to the printed-circuit part along a breaking zone and which can be removed from the printed-circuit part by severing the breaking zone, and
   (2) a rechargeable battery having two terminals, which are each connected to a terminal zone on the terminal part of the printed circuit board in an electrically conductive manner,
   (3) retaining means for mechanically retaining the battery, which battery, after the terminal part of the printed circuit board has been severed from the printed-circuit part of the printed circuit board, together with the severed terminal part of the printed circuit board can be removed from the product in order to dispose of the battery, wherein the retaining means and the printed circuit board are arranged and constructed so as to be mechanically separate from one another, in such a manner that the printed circuit board does not form part of the retaining means for mechanically retaining the battery, and each of the two terminals of the battery is connected to a terminal zone on the terminal part of the printed circuit board in an electrically conductive manner via a mechanically flexible and electrically conductive connecting means.

2. A product as claimed in claim 1, wherein the retaining means are formed by bounding portions of a receptacle for holding the battery.

3. A product as claimed in claim 1, which has a housing for accommodating the printed circuit board, the rechargeable battery and the retaining means, wherein the receptacle has been provided in a battery drawer which can be pulled out of the housing of the product, which battery drawer also accommodates the printed circuit board adjacent the receptacle.

4. A product which comprises:
   (1) a printed circuit board which comprises a printed-circuit part having at least one conductor track and a terminal part which is connected to the printed-circuit part along a breaking zone and which can be removed from the printed-circuit part by severing the breaking zone,
   (2) a rechargeable battery having two terminals, which are each connected to a terminal zone on the terminal part of the printed circuit board in an electrically conductive manner,
   (3) retaining means for mechanically retaining the battery, which battery, after the terminal part of the printed circuit board has been severed from the printed-circuit part of the printed circuit board, together with the severed terminal part of the printed circuit board can be removed from the product in order to dispose of the battery,
   wherein the retaining means and the printed circuit board are arranged and constructed so as to be mechanically separate from one another, in such a manner that the printed circuit board does not form part of the retaining means for mechanically retaining the battery, and each of the two terminals of the battery is connected to a terminal zone on the terminal part of the printed circuit board in an electrically conductive manner via a mechanically flexible and electrically conductive connecting means, said mechanically flexible and electrically conductive connecting means each being constituted by a length of wire, of which each length of wire has one end connected to a terminal of the battery and has its other end connected to a solder pad forming a terminal zone on the terminal part of the printed circuit board.

5. A product as claimed in claim 4, wherein the terminal part of the printed circuit board exclusively carries the two solder pads forming the terminal zones and two conductor track portions, which lead to the two solder pads and which form part of two conductor tracks which extend from the printed-circuit part to the terminal part across the breaking zone.

6. A product as claimed in claim 5, wherein only a separating slot, which extends between the printed-circuit part and the terminal part, and one or at the most two connecting limbs, which interconnect the printed-circuit part and the terminal part, are situated in the breaking zone.

\* \* \* \* \*